United States Patent
Yamamoto et al.

(10) Patent No.: US 11,372,268 B2
(45) Date of Patent: Jun. 28, 2022

(54) LIGHT-EMITTING UNIT, DISPLAY UNIT, AND LIGHTING UNIT

(71) Applicant: Sony Group Corporation, Tokyo (JP)

(72) Inventors: Takeshi Yamamoto, Tokyo (JP); Soya Araki, Kanagawa (JP); Yoshinori Tachikawa, Tokyo (JP); Yohei Azuma, Kanagawa (JP); Yoichiro Eshita, Tokyo (JP); Hayato Niwa, Tokyo (JP)

(73) Assignee: Sony Group Corporation

( * ) Notice: Subject to any disclaimer, the term of this patent is extended or adjusted under 35 U.S.C. 154(b) by 86 days.

(21) Appl. No.: 16/767,218

(22) PCT Filed: Oct. 24, 2018

(86) PCT No.: PCT/JP2018/039472
§ 371 (c)(1),
(2) Date: May 27, 2020

(87) PCT Pub. No.: WO2019/111570
PCT Pub. Date: Jun. 13, 2019

(65) Prior Publication Data
US 2020/0386380 A1    Dec. 10, 2020

(30) Foreign Application Priority Data

Dec. 6, 2017  (JP) .............................. JP2017-234628

(51) Int. Cl.
*G02F 1/01* (2006.01)
*E06B 9/40* (2006.01)
(Continued)

(52) U.S. Cl.
CPC .............. *G02F 1/0121* (2013.01); *E06B 9/40* (2013.01); *F21S 13/02* (2013.01); *F21V 9/08* (2013.01);
(Continued)

(58) Field of Classification Search
CPC .......... G02F 1/0121; G02F 1/13; G02F 1/133; G02F 1/1333; G02F 1/1335;
(Continued)

(56) References Cited

U.S. PATENT DOCUMENTS

2014/0191503 A1   7/2014  Skinner et al.
2015/0309248 A1   10/2015 Xu
(Continued)

FOREIGN PATENT DOCUMENTS

CN    204357328 U    5/2015
CN    104885002 A    9/2015
(Continued)

OTHER PUBLICATIONS

International Search Report for PCT/JP2018/039472 dated Jan. 29, 2019; 3 pages.

*Primary Examiner* — Joseph L Williams
*Assistant Examiner* — Jose M Diaz
(74) *Attorney, Agent, or Firm* — Lerner, David, Littenberg, Krumholz & Mentlik, LLP

(57) ABSTRACT

There is provided a display unit that is able to provide an indoor environment comfortable to a user. This display unit includes a frame member and a flexible display. The frame member is disposed, in a structure including a daylighting section that lets light through, around the daylighting section and includes a winder including a rotary shaft. The flexible display includes a dimming layer and a display device layer including a light-emitting layer disposed on the dimming layer, and is windable with rotation of the rotary shaft provided in the winder of the frame member and drawable from the winder.

11 Claims, 8 Drawing Sheets

(51) Int. Cl.
    *F21S 13/02*     (2006.01)
    *F21V 9/08*     (2018.01)
    *G09G 5/10*     (2006.01)
    *H01L 27/32*     (2006.01)
    *H01L 51/00*     (2006.01)
    *H04R 1/02*     (2006.01)
    *H05B 47/10*     (2020.01)
    *E06B 9/24*     (2006.01)

(52) U.S. Cl.
    CPC ........... *G09G 5/10* (2013.01); *H01L 27/3269* (2013.01); *H01L 51/0097* (2013.01); *H04R 1/028* (2013.01); *H05B 47/10* (2020.01); *E06B 2009/2417* (2013.01); *G09G 2360/14* (2013.01); *G09G 2380/02* (2013.01); *H01L 2251/5338* (2013.01); *H04R 2400/11* (2013.01); *H04R 2499/15* (2013.01)

(58) Field of Classification Search
    CPC .. G02F 1/1347; G02F 1/13476; G02F 1/1313; G02F 1/1323; G02F 1/1326; G02F 1/135; G02F 1/1351; G02F 1/1357; G02F 1/165; E06B 9/40; E06B 2009/2417; E06B 5/00; E06B 7/28; E06B 9/24; E06B 2009/2464; E06B 2009/247; F21S 13/02; F21V 9/08; G09G 5/10; G09G 2380/02; G09G 2320/0646; G09G 2360/144; G09G 2360/14; G09G 3/3406; H04R 1/028; H04R 2400/11; H04R 2499/15; H05B 47/10; H05B 33/02; H01L 2251/5338; H01L 51/50; H01L 51/0097; H01L 27/32; H01L 27/3269; Y02E 10/549; G09F 9/00; G09F 9/30

See application file for complete search history.

(56) References Cited

U.S. PATENT DOCUMENTS

2021/0392765 A1*  12/2021  Pyo ............... G02F 1/1333
2021/0407343 A1*  12/2021  Wu .............. G06F 1/1652
2022/0022332 A1*  1/2022  Cha ............. H01L 51/0097
2022/0029124 A1*  1/2022  Kang ............ H01L 51/524

FOREIGN PATENT DOCUMENTS

| | | |
|---|---|---|
| DE | 202007016244 U1 | 3/2008 |
| JP | 20142348 A | 1/2014 |
| JP | 20164609 A | 1/2016 |
| JP | 201727734 A | 2/2017 |
| WO | 2012084822 A2 | 6/2012 |

\* cited by examiner

[ FIG. 1A ]
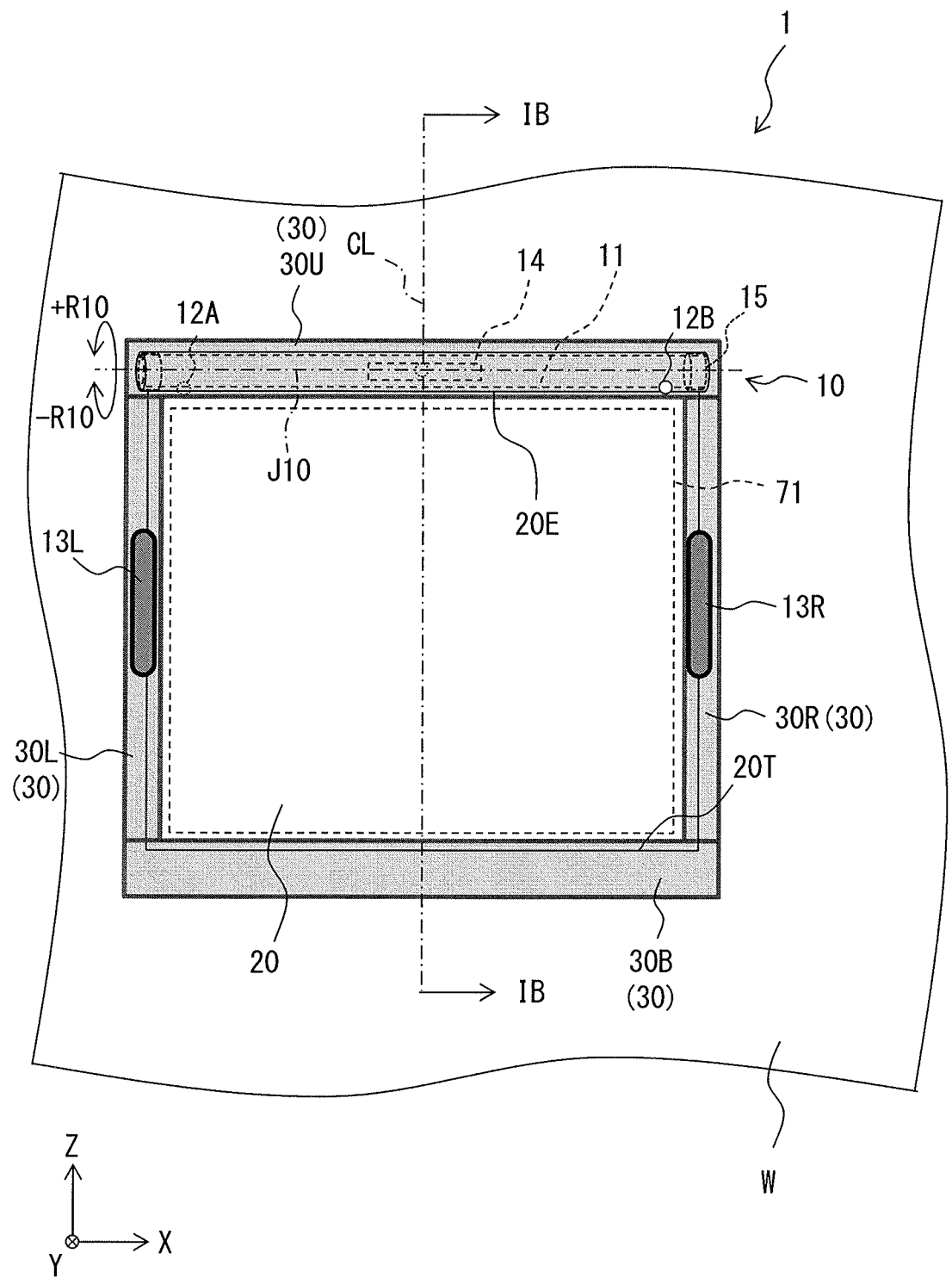

[FIG. 1B]
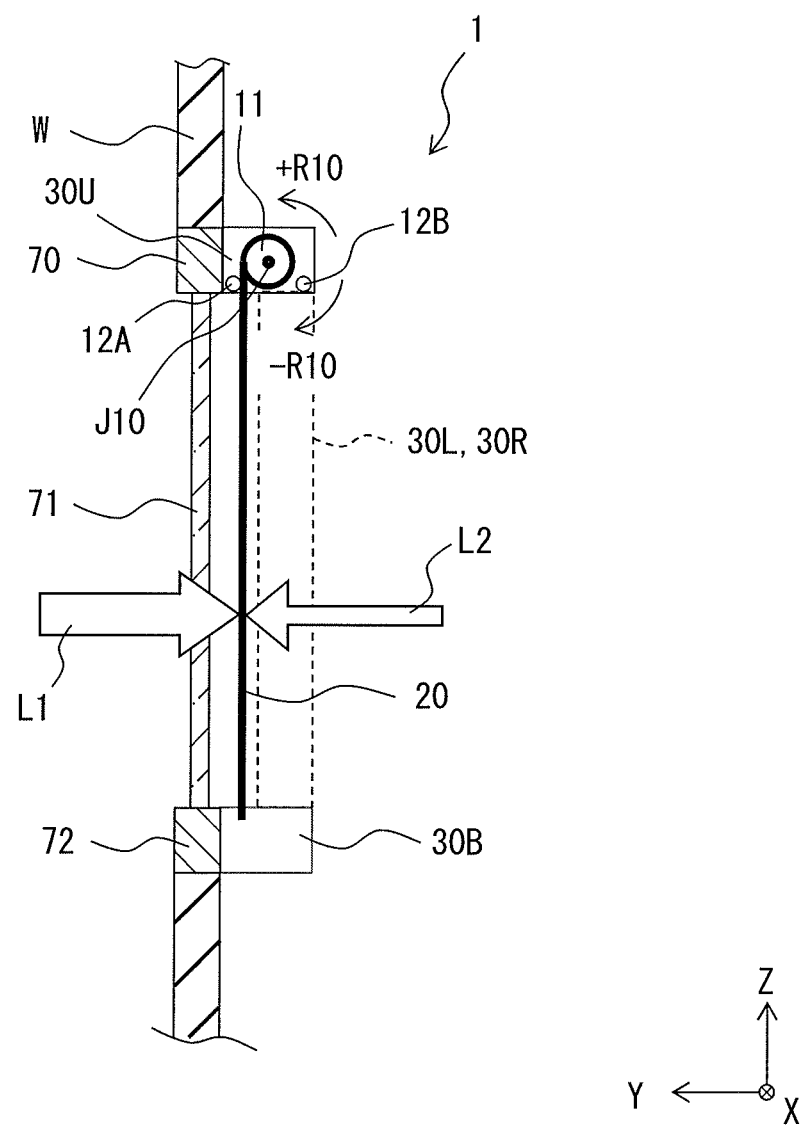

[ FIG. 1C ]
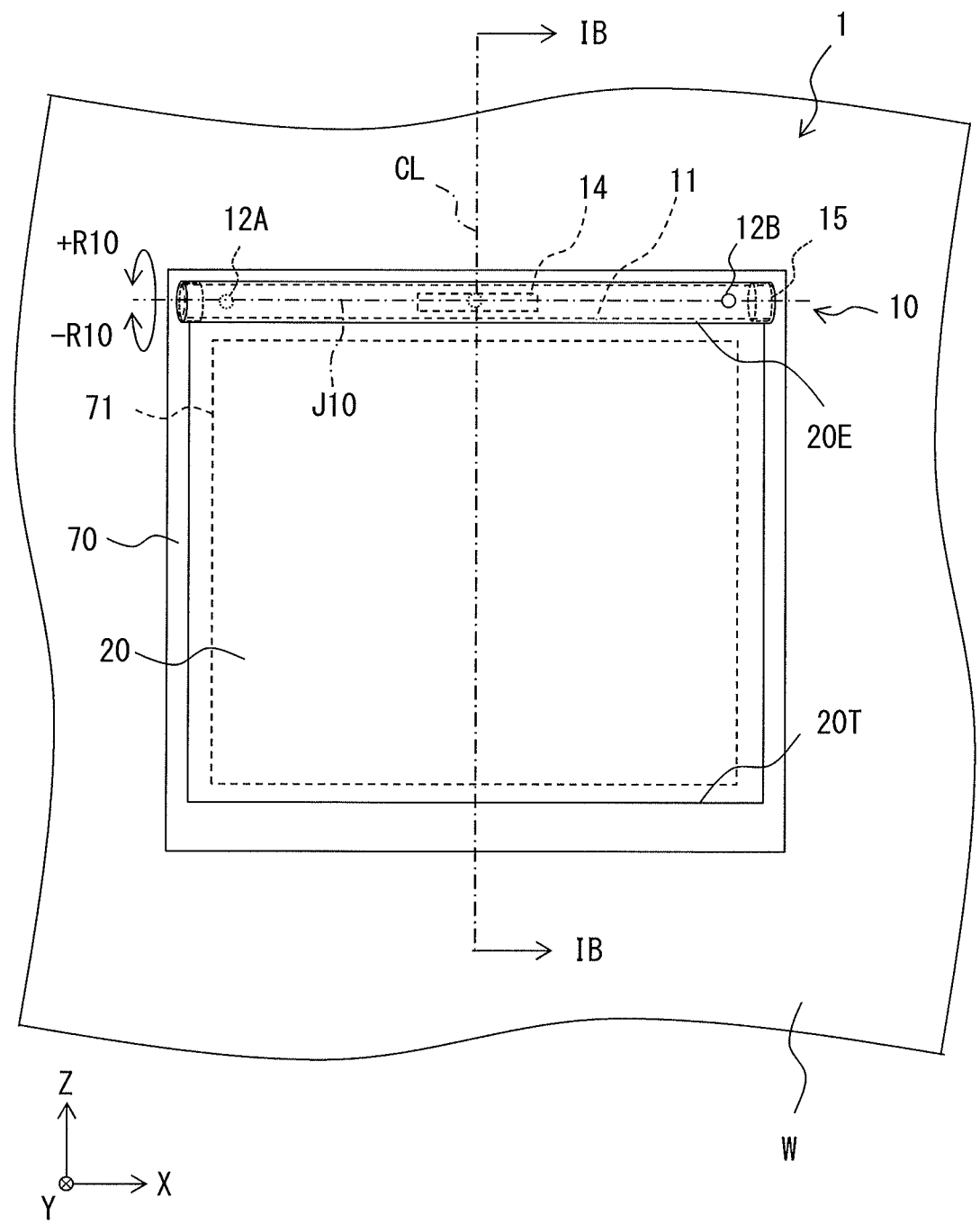

[FIG. 2]
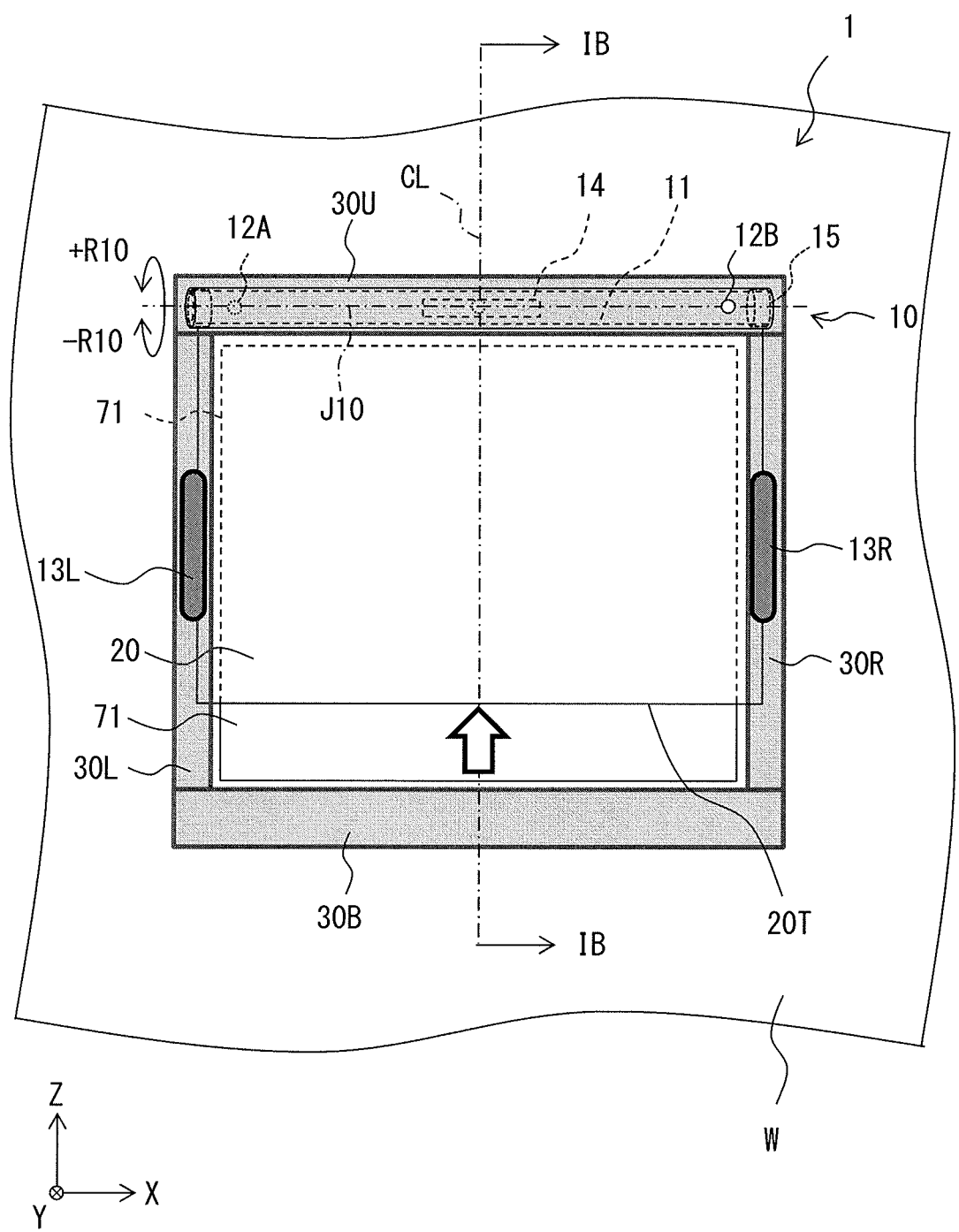

[ FIG. 3 ]
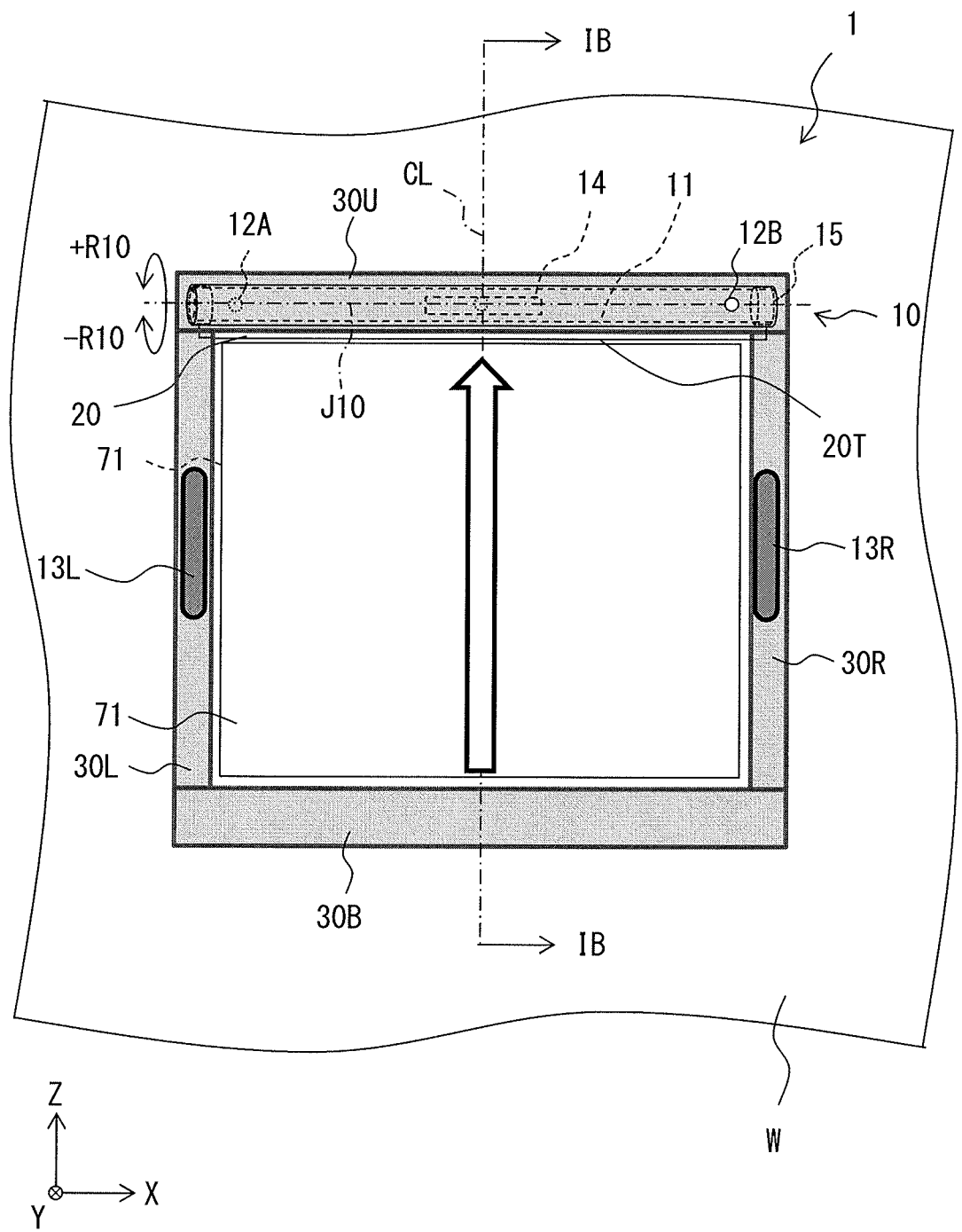

[ FIG. 4 ]
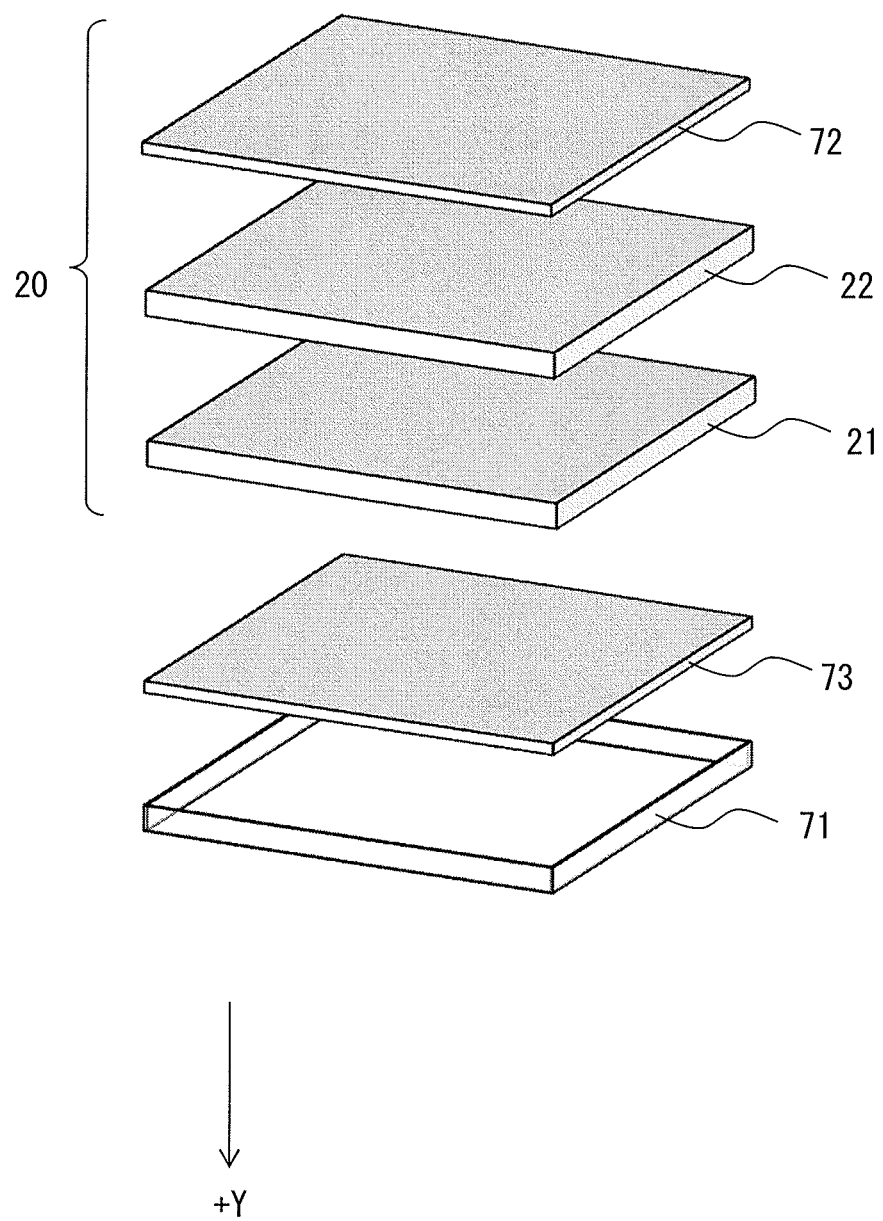

[FIG. 5]
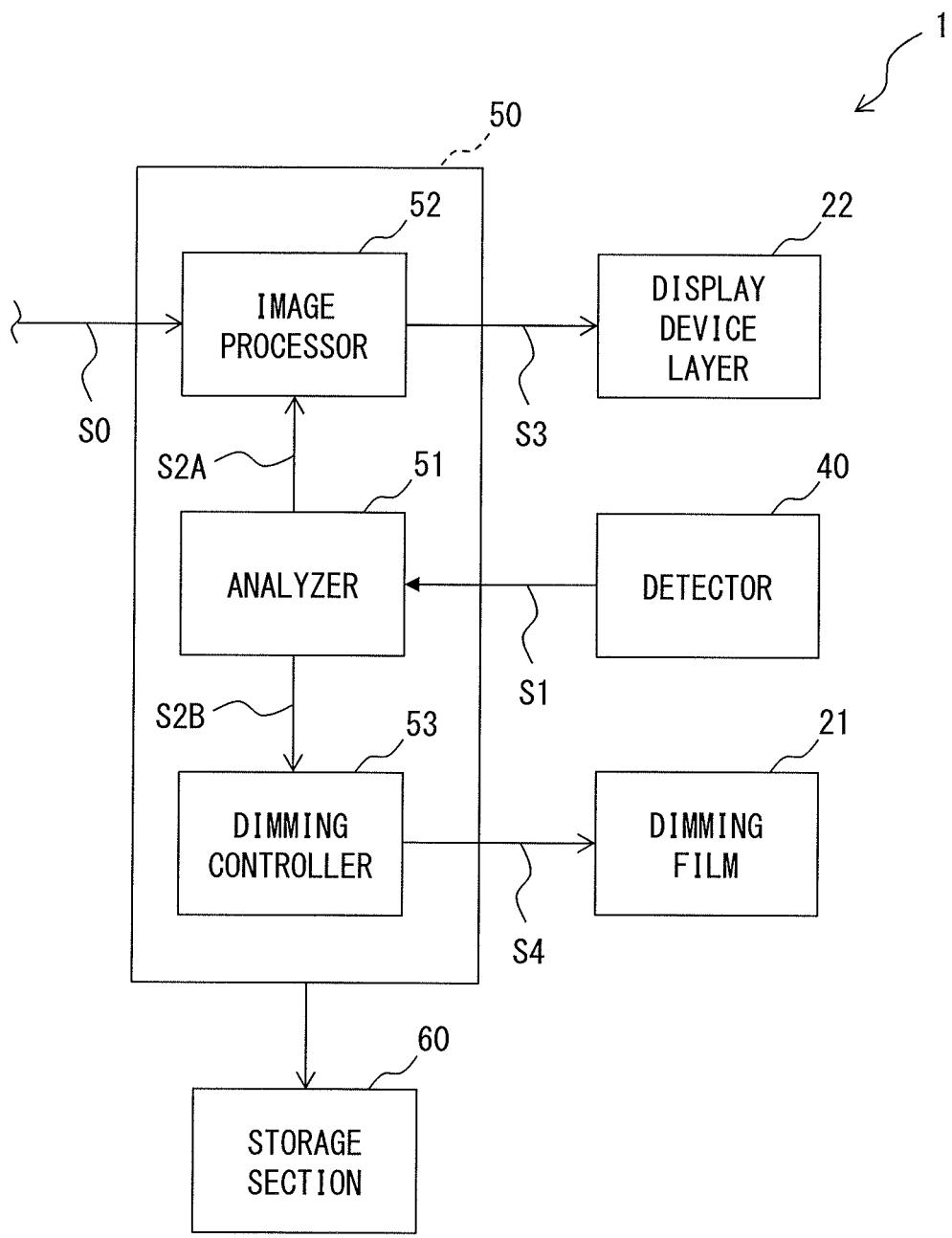

[ FIG. 6 ]
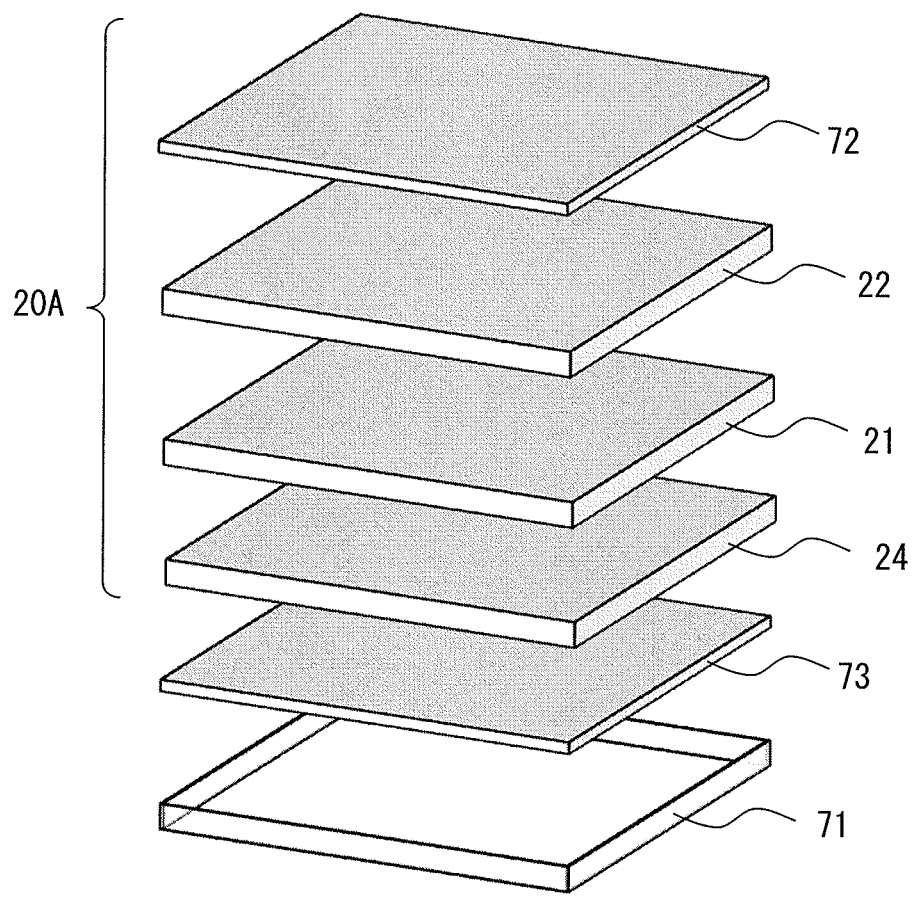

ND LIGHTING UNIT

LIGHT-EMITTING UNIT, DISPLAY UNIT, AND LIGHTING UNIT

CROSS-REFERENCE TO RELATED APPLICATIONS

This application is a national phase entry under 35 U.S.C. § 371 of International Application No. PCT/JP2018/039472 filed Oct. 24, 2018, which claims the priority from Japanese Patent Application No. 2017-234628 filed in the Japanese Patent Office on Dec. 6, 2017, the entire contents of which are hereby incorporated by reference.

TECHNICAL FIELD

The present disclosure relates to a light-emitting unit usable as a surface light source, and a display unit and a lighting unit each including the same.

BACKGROUND ART

A display unit including a flexible display panel with flexibility that is foldable and windable has been proposed before (for example, see PTL 1).

CITATION LIST

Patent Literature

PTL 1: Japanese Unexamined Patent Application Publication No. 2014-2348

SUMMARY OF THE INVENTION

Recent display units are obviously increased in screen size and reduced in thickness. However, a further increase in the screen size of a display unit increases a proportion of the display unit to an indoor space or an indoor wall surface where the display unit is installed. This increases presence of the display unit in a usage environment of the display unit, raising a concern about a possibility of impairing comfortableness supposed to be provided to a person under the usage environment.

Accordingly, it is desirable to provide a light-emitting unit, a display unit, and a lighting unit that are able to provide an indoor environment comfortable to a user.

A light-emitting unit according to an embodiment of the present disclosure includes a frame member and a flexible sheet. The frame member is disposed, in a structure including a daylighting section that lets light through, around the daylighting section, and includes a winder including a rotary shaft. The flexible sheet includes a dimming layer and a light-emitting layer disposed on the dimming layer, and is windable with rotation of the rotary shaft provided in the winder of the frame member and drawable from the winder.

A display unit according to an embodiment of the present disclosure includes a frame member and a flexible display. The frame member is disposed, in a structure including a daylighting section that lets light through, around the daylighting section, and includes a winder including a rotary shaft. The flexible display includes a dimming layer and a display device layer including a light-emitting layer disposed on the dimming layer, and is windable with rotation of the rotary shaft provided in the winder of the frame member and drawable from the winder.

A lighting unit according to an embodiment of the present disclosure includes a light-emitting unit. The light-emitting unit includes a frame member and a flexible sheet. The frame member is disposed, in a structure including a daylighting section that lets light through, around the daylighting section, and includes a winder including a rotary shaft. The flexible sheet includes a dimming layer and a light-emitting layer disposed on the dimming layer, and is windable with rotation of the rotary shaft provided in the winder of the frame member and drawable from the winder.

According to the light-emitting unit, the display unit, and the lighting unit according to the embodiments of the present disclosure, it is possible to achieve an indoor environment comfortable to a user.

It is to be noted that effects of the present disclosure are not necessarily limited to the effects described above, and may include any of effects that are described below.

BRIEF DESCRIPTION OF DRAWING

FIG. 1A is a front view of an entire configuration example of a display unit according to an embodiment of the present disclosure.

FIG. 1B is a cross-sectional view of a configuration of the display unit illustrated in FIG. 1A.

FIG. 1C is a front view of an entire configuration example of the display unit of FIG. 1A with a portion of components omitted.

FIG. 2 is a front view of an intermediate state of the display unit illustrated in FIG. 1A.

FIG. 3 is a front view of a stored state of the display unit illustrated in FIG. 1A.

FIG. 4 is an explanatory diagram illustrating a stacking configuration of a display section of the display unit illustrated in FIG. 1A.

FIG. 5 is a block diagram illustrating a schematic configuration example of the display unit illustrated in FIG. 1.

FIG. 6 is an explanatory diagram illustrating a stacking configuration of a display section of a display unit according to a modification example.

MODES FOR CARRYING OUT THE INVENTION

In the following, an embodiment of the disclosure is described in detail with reference to the drawings. It is to be noted that description is made in the following order.

1. Embodiment

An example of a display unit where a flexible display with a stacking structure of a dimming layer and a display device layer is attached to a window frame.

2. Modification Example

1. Embodiment

[Configuration of Display Unit 1]

FIG. 1A schematically illustrates an entire configuration example of a display unit 1 according to an embodiment of the present disclosure. FIG. 1A is a schematic front view of, in particular, an unwound state where a display section 20 is fully drawn from a winder 10. FIG. 1B is a cross-sectional view of a cross section of the display unit 1, which faces an arrow direction, along a IB-IB line extending in a vertical direction in FIG. 1A. It is to be noted that the IB-IB line includes a middle line CL representing a middle position of the display unit 1 in a horizontal direction. FIG. 1C is a schematic view of the display unit 1 with a frame 30, etc. illustrated in FIG. 1A removed. FIG. 2 is a schematic front view of an intermediate state where the display section 20 partially covers a window glass 71. FIG. 3 is schematic a front view of a stored state where the display section 20 of the display unit 1 is stowed in the winder 10. FIG. 4 is an explanatory diagram illustrating a stacking configuration of the display section 20 of the display unit 1. Further, FIG. 5 is a block diagram illustrating a schematic configuration example of the display unit 1. It is to be noted that, herein, the horizontal direction is referred to as an X-axis direction, the vertical direction is referred to as a Z-axis direction, and a direction orthogonal to both of these X-axis direction and Y-axis direction, where the window glass 71 (described later) and the display section 20 overlap each other, is referred to as a Y-axis direction.

As illustrated in FIG. 1A, etc. the display unit 1 includes the winder 10, the display section 20, and the frame 30. As illustrated in FIG. 5, the display unit 1 further includes a detector 40, a controller 50, and a storage section 60.

The display unit 1 is installed on an annular window frame 70 disposed on a wall W, i.e., a structure, for example. The window glass 71 serving as a daylighting section, that lets light from outside (external light) through is mounted in the window frame 70. Thus, the display unit 1 is installed around the window glass 71 at an indoor side of the wall W.

As illustrated in FIG. 1A to FIG. 1C, the frame 30 of the display unit 1 is attached at an indoor side of the window frame 70, overlapping the window frame 70 in the Y-axis direction. The frame 30 includes four portions: an upper frame 30U, a lower frame 30B, a right frame 30R, and a left frame 30L. The upper frame 30U and the lower frame 30B extend in the X-axis direction respectively along an upper edge and a lower edge of the window glass 71 as viewed by a person in a room. Meanwhile, the right frame 30R and the left frame 30L extend in the Z-axis direction respectively along a right edge and a left edge of the window glass 71 as viewed by the person in the room. The right frame 30R and the left frame 30L are respectively provided with, for example, speakers 13L and 13R. The speakers 13L and 13R each include an actuator that reproduces sound information.

(Winder 10)

As illustrated in FIG. 1A, etc., the winder 10 includes a shaft 11 rotatable bidirectionally in a +R10 direction and a −R10 direction around a rotary axis J10. The shaft 11 is provided inside the upper frame 30U. A motor 15 that causes rotation of the shaft 11 is attached to an end of the shaft 11. The winder 10 is able to wind the display section 20, which is in a form of sheet with flexibility, around the shaft 11 with rotation of the shaft 11 around the rotary axis J10 in the −10R direction, for example (see FIG. 2 and FIG. 3). The shaft 11 includes a substantially cylindrical member including a material with a rigidity higher than that of the display section 20, examples of which include a metal material such as stainless steel and a hard resin. Luminance sensors 12A and 12B, a control board 14, etc. are provided inside the upper frame 30U. Moreover, the winder 10 ejects the display section 20 sequentially from a distal end 20T with rotation of the shaft 11, a rotation center of which is the rotary axis J10, in the +R10 direction. It is to be noted that the shaft 11 is disposed with the rotary axis J10 being parallel with an X-axis in the present embodiment. The display section 20 is ejected in a −Z direction along a Z-axis.

The luminance sensor 12A includes, for example, an electronic device such as a photodiode that changes an output voltage in accordance with a level of luminance of light L1 entering the display section 20 through the window glass 71 (see FIG. 1B). The light L1 is external light. Meanwhile, the luminance sensor 12B includes, for example, an electronic device such as a photodiode that changes an output voltage in accordance with a level of luminance of light L2 entering the display section 20 through a side opposite to the wall W (see FIG. 1B). It is to be noted that the luminance sensors 12A and 12B are each a component of the detector 40 (FIG. 5).

The control board 14 includes, for example, an operation receiver that receives an operation by a viewer, a power supply that receives externally supplied power, an NFC communicator that performs external data communication, etc. The control board 14 preferably further includes a RAM (Random Access Memory), a ROM (Read Only Memory), a CPU (Central Processing Unit), etc., for example. The ROM is a rewritable non-volatile memory that stores a variety of information to be used by the display unit 1. The ROM stores a program to be executed by the display unit 1 and a variety of setting information based on various information detected by the detector 40. The CPU controls an operation of the display unit 1 by executing various programs stored in the ROM. The RAM functions as a temporal storage region in a case where this CPU executes a program. The RAM and the ROM are each a component of the storage section 60 (FIG. 5).

(Display Section 20)

The display section 20 is a so-called flexible display in the form of sheet with flexibility, which is able to be stowed in the winder 10. As illustrated in FIG. 4, the display section 20 has a stacking structure where a dimming film 21, a display device layer 22, and a light absorbing layer 72 are stacked in sequence in a direction away from the window glass 71 (−Y direction).

The dimming film 21 of the display section 20 is an optical film that is able to adjust a transmittance of visible light passing through the dimming film 21 itself. The dimming film 21 includes, for example, two oppositely disposed resin films, two transparent conductive layers oppositely applied on respective opposite surfaces of these two resin films, and a plurality of oriented particles sandwiched between these two transparent conductive layers. The transmittance at the dimming film 21 is adjustable by applying voltage, through the two transparent conductive layers, to the plurality of oriented particles.

The display device layer 22 of the display section 20 includes, for example, a plurality of pixels using a self-emitting device, such as an organic EL (Electro Luminescence) device, or a display device, such as a liquid crystal device. The display device layer 22 displays an image with a predetermined luminance on the basis of a control signal S3 supplied from a later-described image processor 52.

A base end 20E of the display section 20 is coupled to the shaft 11 of the winder 10. The rotation of the shaft 11 in the −R10 direction around the rotary axis J10 allows the display section 20 to be wound on the winder 10 in sequence from the base end 20E toward the distal end 20T. It is to be noted that in the stored state illustrated in FIG. 3, the display section 20 is almost fully stowed in the winder 10 and thus it is not possible for a viewer to see the display section 20. Meanwhile, the rotation of the shaft 11 in the +R10 direction around the rotary axis J10 allows the display section 20 to be ejected from the winder 10 in, for example, the −Z direction in sequence from the distal end 20T toward the base end 20E. The display section 20 in an unwound state (FIG. 1A) drawn from the winder 10 may cover the entirety of the window glass 71.

The light absorbing layer 72, which is disposed to cover the display device layer 22 of the display section 20, is an optical member that lets red light, green light, and blue light through while absorbing wavelength light other than the red light, green light, and blue light. A light absorbing layer 73 is preferably further disposed between the window glass 71 and the dimming film 21 in addition to the light absorbing layer 72. This light absorbing layer 73 has characteristics opposite to those of the light absorbing layer 72. That is, the light absorbing layer 73 absorbs the red light, green light, and blue light while letting at least a portion of the wavelength light other than the red light, green light, and blue light through. The light absorbing layer 73 may be bonded to an inside of the window glass 71, for example. Disposing the light absorbing layer 72 and the light absorbing layer 73 makes it possible to take a certain amount of external light, namely, the light L1, through the window glass 71 in the room while reducing reflection of the light L1 on a display surface of the display section 20.

(Detector 40)

The detector 40 includes the luminance sensors 12A and 12B provided in the upper frame 30U covering the winder 10 as described above. The detector 40 functions to acquire a variety of information including luminance information regarding the display unit 1 with the luminance sensors 12A and 12B and send the variety of information as a detection signal S1 to an analyzer 51 (described later) of the controller 50 as illustrated in FIG. 5, for example.

(Controller 50)

The controller 50 includes the analyzer 51, the image processor 52, and a dimming controller 53 as illustrated in FIG. 3 as functions of the CPU provided on the control board 14, for example.

The analyzer 51 analyzes the variety of information sent from the detector 40 and estimates, as a result of the analysis, a state of the display unit 1, especially, indoor brightness and outdoor brightness, i.e., the luminance of each of the light L1 and the light L2 reaching the display section 20. For example, the analyzer 51 may estimate luminance at each of a front surface and a rear surface of the display section 20 by analyzing changes in output currents detected with the luminance sensor 12A.

The analyzer 51 sends the result of the analysis as an analysis signal S2A to the image processor 52 and as an analysis signal S2B to the dimming controller 53. The image processor 52 performs image processing, such as applying luminance correction to an externally inputted image signal S0, on the basis of the analysis signal S2A from the analyzer 51. The image processor 52 sends the control signal S3 having been subjected to the image processing to the display device layer 22 of the display section 20 (FIG. 5). Meanwhile, the dimming controller 53 performs dimming control, that is, adjustment of the transmittance at the dimming film 21, on the basis of the analysis signal S2B from the analyzer 51, that is, at least one of the luminance of the light L1 or the luminance of the light L2. For example, the transmittance at the dimming film 21 is reduced in a case where the light L1 with a high luminance enters on a sunny day, and the transmittance of the dimming film 21 is increased in a case where the light L1 with a low luminance enters on a cloudy or rainy day. This is beneficial in ensuring comfortable indoor brightness.

In addition, the image processor 52 may perform emission luminance control through the display device layer 22 of the display section 20 in conjunction with the dimming control by the dimming controller 53. For example, in a case where the light L1 with a high luminance enters on a sunny day, it is preferable that the transmittance of the dimming film 21 be reduced while emission luminance of the display device layer 22 be increased. In contrast, in a case where the light L1 with a low luminance enters on a cloudy or rainy day, it is preferable that the transmittance of the dimming film 21 be increased while the emission luminance of the display device layer 22 be slightly restricted. This is beneficial in allowing a viewer to comfortably watch an image on the display section 20 in addition to ensuring the comfortable indoor brightness.

(Storage Section 60)

The storage section 60 accumulates, for example, result data regarding the dimming control and the emission luminance control by the controller 50. The controller 50 preferably performs, on the basis of the result data accumulated in the storage section 60, another dimming control and another emission luminance control afterwards.

[Operation of Display Unit 1]

First, description will be made on a basic operation of the display unit 1. When the display unit 1 is turned off, this display unit 1 is in the stored state illustrated in FIG. 3. That is, the display section 20 is stored in the winder 10 and thus the window glass 71 is uncovered by the display section 20, making the window glass 71 fully visible to a person in the room. When the display unit 1 is turned on by operating a remote controller or the like, the display unit 1 shifts from the stored state of FIG. 3 via the intermediate state of FIG. 2 to the unwound state of FIGS. 1A to 1C. The window glass 71 is thus fully covered by the display section 20. It is to be noted that the ejection of the display section 20 may be stopped halfway by operating the remote controller or the like. Alternatively, the display unit 1 may be turned on in response to voice instructions or the image signal S0 externally inputted to the image processor 52. Moreover, for example, the display unit 1 acquires luminance information regarding the light L1 and the light L2 with the luminance sensors 12A and 12B at all times, and stores the luminance information in, for example, the storage section 60 of the control board 14 in accordance with instructions by the controller 50.

In this display unit 1, as illustrated in FIG. 5, the image processor 52 performs the image processing on the externally inputted image signal S0 and the control signal S3 generated by the image processor 52 is inputted to the display device layer 22 of the display section 20. The image processing is performed on the basis of the analysis signal S2A from the analyzer 51. In this regard, the image processor 52 may perform the emission luminance control to adjust the emission luminance of the display device layer 22 on the basis of the analysis signal S2A. The analyzer 51 performs the analysis on the basis of the variety of information contained in the detection signal S1 from the detector 40. The display device layer 22 of the display section 20 displays an image on the basis of the control signal S3 from the image processor 52.

Further, in the display unit 1, the dimming controller 53 adjusts the transmittance at the dimming film 21 on the basis of the analysis signal S2B from the analyzer 51 as illustrated in FIG. 5.

[Workings and Effects of Display Unit 1]

As described above, the display unit 1 according to the present embodiment includes the display section 20 including the display device layer 22, which is able to be wound by the winder 10 of the upper frame 30U disposed around the window glass 71 and drawn from the winder 10. Thus, the display section 20 is unlikely to impair appearance of a living space, even though having a large size. Moreover, the display section 20 includes the dimming film 21, allowing the light L1 through the window glass 71 to be controlled. This makes it possible to ensure brightness suitable to the living space and, further, is beneficial in protecting privacy of the living space.

Moreover, the display section 20 of the display unit 1 is drawn from the winder 10, which makes it possible to cover the entirety of the window glass 71. This makes it possible to further improve comfortability for the person in the room.

Moreover, the display unit 1 includes the luminance sensors 12A and 12B, allowing the dimming control of the dimming film 21 to be performed by the dimming controller 53 of the controller 50 on the basis of at least one of the light L1 or the light L2. This makes it easy to provide a suitable brightness of the living space in accordance with luminance of indoor space, outdoor space, or both.

Moreover, the image processor 52 of the display unit 1 is able to perform the emission luminance control of the display device layer 22 in conjunction with the dimming control by the dimming controller 53. In this case, light emission from the display device layer 22 is able to be more clearly seen while reducing an influence of the external light (light L1) on a viewer, for example.

Moreover, the controller 50 of the display unit 1 is able to perform another dimming control and another emission operation control on the basis of the result data accumulated in the storage section 60. In this case, a further optimized living space environment is promptly provided by learning preference of a viewer, for example.

Moreover, in the display unit 1, the frame 30 fixed to the window frame 70 is provided with the control board 14 including the controller 50, the speakers 13L and 13R, the motor 15, etc. The frame 30 is thus effectively usable.

2. Modification Examples

Although the description has been given with reference to some embodiments and modification examples, the present disclosure is not limited thereto, and may be modified in a variety of ways. For example, the speakers 13L and 13R are provided inside the left frame 30L and the right frame 30R in the above-described embodiment, etc.; however, the present disclosure is not limited thereto. According to the present disclosure, a vibration member 24 with flexibility, such as a piezo film, may be provided on a rear surface of the dimming film 21 to regenerate sound information by causing vibration of the vibration member 24 as in a display section 20A illustrated in FIG. 6, for example. In this case, the vibration member 24 may include a plurality of stacked piezo films.

In the above-described embodiment, etc., the detector is exemplified by the luminance sensors; however, the present disclosure is not limited thereto and other sensors or the like may be provided if necessary. In addition, installation positions of the respective sensors are not limited to those described in the above-described embodiment, etc. but may be changed if necessary.

Moreover, the dimming film and the display device layer have the same shape and the same dimension in the above-described embodiment; however, the present technology is not limited thereto. For example, an outer edge of a light-emitting layer (display device layer) may be located inside with respect to an outer edge of the dimming film.

Moreover, in the above-described embodiment, the present technology is described by taking the display unit 1 including the display section 20 as an example; however, the present technology is applicable to units other than a display unit. For example, the present technology is also applicable to a light-emitting unit including, instead of a display section including a display device layer, a flexible sheet including a light-emitting layer including an organic EL device or the like and to a lighting unit including the light-emitting unit. In this case, in a case where external light with a high luminance enters the flexible sheet on a sunny day, for example, it is preferable that the transmittance of the dimming film be increased, while the emission luminance of the light-emitting layer be reduced or emission from the light-emitting layer be stopped. In contrast, in a case where external light with a low luminance enters the flexible sheet on a cloudy or rainy day, it is preferable that the transmittance of the dimming film 21 be increased while the emission luminance of the light-emitting layer be also increased. This makes it possible to ensure comfortable indoor brightness.

It is to be noted that effects described herein are merely exemplified. Effects of the disclosure are not limited to the effects described herein. Effects of the disclosure may further include other effects. Moreover, the present technology may have the following configurations.

(1)

A light-emitting unit including:

a frame member disposed, in a structure including a daylighting section that lets light through, around the daylighting section, the frame member including a winder including a rotary shaft; and a flexible sheet including a dimming layer and a light-emitting layer disposed on the dimming layer, the flexible sheet being windable with rotation of the rotary shaft provided in the winder of the frame member and being drawable from the winder.

(2)

The light-emitting unit according to (1), in which the flexible sheet is configured to cover an entirety of the daylighting section by being drawn from the winder.

(3)

The light-emitting unit according to (1) or (2), in which an outer edge of the light-emitting layer is located inside with respect to an outer edge of the dimming layer.

(4)

The light-emitting unit according to any one of (1) to (3), further including a controller that performs dimming control to adjust a transmission state of external light, which enters the dimming layer through the daylighting section, at the dimming layer.

(5)

The light-emitting unit according to (4), further including at least one of a first luminance sensor that measures a luminance of first light entering the dimming layer through the daylighting section or a second luminance sensor that measures a luminance of second light entering the dimming layer from a side opposite to the structure, in which the controller performs the dimming control on the basis of at least one of the luminance of the first light or the luminance of the second light.

(6)

The light-emitting unit according to (5), in which the controller performs emission luminance control of the light-emitting layer of the flexible sheet in conjunction with the dimming control.

(7)

The light-emitting unit according to (6), further a storage section that accumulates result data regarding the dimming control and the emission luminance control by the controller, in which the controller performs another dimming control and another emission luminance control on the basis of the result data accumulated in the storage section.

(8)

The light-emitting unit according to (4), in which the frame member includes at least one of a control board or a speaker, the control board including the controller.

(9)

A display unit including:
a frame member disposed, in a structure including a daylighting section that lets light through, around the daylighting section, the frame member including a winder including a rotary shaft; and
a flexible display including a dimming layer and a display device layer including a light-emitting layer disposed on the dimming layer, the flexible display being windable with rotation of the rotary shaft provided in the winder of the frame member and being drawable from the winder.

(10)

The display unit according to (9), further including:
a first light absorbing film disposed to cover the display device layer of the flexible display, the first light absorbing film letting red light, green light, and blue light through and absorbing wavelength light other than the red light, the green light, and the blue light; and
a second light absorbing film disposed for the daylighting section, the second light absorbing film absorbing the red light, the green light, and the blue light and letting at least a portion of the wavelength light other than the red light, the green light, and the blue light through.

(11)

A lighting unit including a light-emitting unit, the light-emitting unit including
a frame member disposed, in a structure including a daylighting section that lets light through, around the daylighting section, the frame member including a winder including a rotary shaft, and
a flexible sheet including a dimming layer and a light-emitting layer disposed on the dimming layer, the flexible sheet being windable with rotation of the rotary shaft provided in the winder of the frame member and being drawable from the winder.

This application claims the benefit of Japanese Priority Patent Application JP2017-234628 filed on Dec. 6, 2017, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A light-emitting unit comprising:
a frame member disposed, in a structure including a daylighting section that lets light through, around the daylighting section, the frame member including a winder including a rotary shaft; and
a flexible sheet including a dimming layer and a light-emitting layer disposed on the dimming layer, the flexible sheet being windable with rotation of the rotary shaft provided in the winder of the frame member and being drawable from the winder.

2. The light-emitting unit according to claim 1, wherein the flexible sheet is configured to cover an entirety of the daylighting section by being drawn from the winder.

3. The light-emitting unit according to claim 1, wherein an outer edge of the light-emitting layer is located inside with respect to an outer edge of the dimming layer.

4. The light-emitting unit according to claim 1, further comprising a controller that performs dimming control to adjust a transmission state of external light, which enters the dimming layer through the daylighting section, at the dimming layer.

5. The light-emitting unit according to claim 4, further comprising at least one of a first luminance sensor that measures a luminance of first light entering the dimming layer through the daylighting section or a second luminance sensor that measures a luminance of second light entering the dimming layer from a side opposite to the structure, wherein
the controller performs the dimming control on a basis of at least one of the luminance of the first light or the luminance of the second light.

6. The light-emitting unit according to claim 5, wherein the controller performs emission luminance control of the light-emitting layer of the flexible sheet in conjunction with the dimming control.

7. The light-emitting unit according to claim 6, further comprising a storage section that accumulates result data regarding the dimming control and the emission luminance control by the controller, wherein
the controller performs another dimming control and another emission luminance control on a basis of the result data accumulated in the storage section.

8. The light-emitting unit according to claim 4, wherein the frame member includes at least one of a control board or a speaker, the control board including the controller.

9. A display unit comprising:
a frame member disposed, in a structure including a daylighting section that lets light through, around the daylighting section, the frame member including a winder including a rotary shaft; and
a flexible display including a dimming layer and a display device layer including a light-emitting layer disposed on the dimming layer, the flexible display being windable with rotation of the rotary shaft provided in the winder of the frame member and being drawable from the winder.

10. The display unit according to claim 9, further comprising:
a first light absorbing film disposed to cover the display device layer of the flexible display, the first light absorbing film letting red light, green light, and blue light through and absorbing wavelength light other than the red light, the green light, and the blue light; and
a second light absorbing film disposed for the daylighting section, the second light absorbing film absorbing the red light, the green light, and the blue light and letting at least a portion of the wavelength light other than the red light, the green light, and the blue light through.

11. A lighting unit comprising a light-emitting unit, the light-emitting unit including
a frame member disposed, in a structure including a daylighting section that lets light through, around the daylighting section, the frame member including a winder including a rotary shaft, and
a flexible sheet including a dimming layer and a light-emitting layer disposed on the dimming layer, the flexible sheet being windable with rotation of the rotary shaft provided in the winder of the frame member and being drawable from the winder.

* * * * *